United States Patent
Trassoudaine et al.

(10) Patent No.: US 6,632,725 B2
(45) Date of Patent: Oct. 14, 2003

(54) PROCESS FOR PRODUCING AN EPITAXIAL LAYER OF GALLIUM NITRIDE BY THE HVPE METHOD

(75) Inventors: Agnès Trassoudaine, Saint-Amant-Tallende (FR); Robert Cadoret, Chamalière (FR); Eric Aujol, Clermont-Ferrand (FR)

(73) Assignees: Centre National de la Recherche Scientifique (CNRS), Paris (FR); Universite Blaise Pascal, Clermont-Ferrand (FR)

( * ) Notice: Subject to any disclaimer, the term of this patent is extended or adjusted under 35 U.S.C. 154(b) by 0 days.

(21) Appl. No.: 09/893,752

(22) Filed: Jun. 29, 2001

(65) Prior Publication Data

US 2003/0013222 A1 Jan. 16, 2003

(51) Int. Cl.⁷ .............................................. H01L 21/20
(52) U.S. Cl. ...................... 438/479; 438/22; 438/483
(58) Field of Search .............................. 438/22, 24, 46, 438/479, 483, 492, 493, 497, 500, 503, 507

(56) References Cited

U.S. PATENT DOCUMENTS 5,254,210 A * 10/1993 Jones et al. ................. 118/725
6,177,292 B1 * 1/2001 Hong et al. ................... 438/46
6,406,540 B1 * 6/2002 Harris et al. ................. 117/104
2002/0028291 A1 * 3/2002 Shabita et al. ........... 427/255.39

OTHER PUBLICATIONS

Hergog et al, "Simulatewd Emission from As–Grown GaN Hexagons by selective Area Growth Hydride Vapor Phase Epitaxy".*
E. Aujol et al.: "Thermodynamical and Kinetic Study of the GaN Growth by HVPE Under Nitrogen", Journal of Crystal Growth 222 (2001) p. 538–548.
A. Trassoudaine et al.: "Experimental and Theoretical Study of the Growth of GaN on Sapphire by HVPE", Phys. Stat. Sol. (a) 176.425 (1999).
Aujol et al., "Hydrogen and nitrogen ambient effects on epitaxial growth of GaN by hydride vapour phase epitaxy," Journal of Crystal Growth (2001), vol. 230, pp. 372–376.
Trassoudaine et al., "A new mechanism in the growth process of GaN by HVPE," Mat. Res. Soc. Symp. Proc. (2001), vol. 639, pp. 321–326, Materials Research Society.

* cited by examiner

*Primary Examiner*—Savitri Mulpuri
(74) *Attorney, Agent, or Firm*—Foley & Lardner

(57) ABSTRACT

A process for producing an epitaxial layer of gallium nitride (GaN) by hydride vapor-phase epitaxy (HVPE), as well as to the epitaxial layers which can be obtained by this process are provided. Such a process makes it possible to avoid parasitic GaN deposition on the walls of the reactor.

22 Claims, 1 Drawing Sheet

PROCESS FOR PRODUCING AN EPITAXIAL LAYER OF GALLIUM NITRIDE BY THE HVPE METHOD

FIELD OF THE INVENTION

The present invention relates generally to deposition of semiconductor layers and specifically to a process for producing an epitaxial layer of gallium nitride (GaN) by the method of hydride vapor-phase epitaxy (HVPE), as well as to the epitaxial layers which can be obtained by said process.

BACKGROUND OF THE INVENTION

Substrates including epitaxial GaN layers are used in optoelectronics. In particular, intense blue to ultraviolet light emitting diodes (LED) are made from these GaN layers.

HVPE is a widely used technique for producing GaN layers. Two of its main characteristics are as follows: versatility of the growth rate (from 1 $\mu$m/h to hundreds of $\mu$m/h) and a vapor phase being close to the thermodynamic equilibrium to obtain localized epitaxies.

In the HVPE process, the following gases are introduced: the carrier gas (nitrogen, helium, argon, hydrogen or a mixture thereof), GaCl as a source of gallium, which can be produced in situ from HCl and Ga in the liquid form, and $NH_3$ as a source of nitrogen.

In the method of hydride vapor-phase epitaxy that is often used as technique of quick growth of GaN, the reactors have hot walls to assure the stability of transportation agents of elements of Group III, in the form of GaCl, obtained by reacting gaseous HCl with liquid gallium inside the reactor.

The transportation agents of elements of Group V are hydrides (i.e., ammonia) which are brought into the reactor by a separate gas line. The vapor phase (GaCl+$NH_3$) is transported towards the substrate zone of the reactor, where the substrate is located, by the carrier gas (nitrogen, helium, argon, hydrogen or a mixture thereof).

The pressure inside the reactor is one atmosphere or less. The reactor is a quartz tube of high purity. The gasses have electronic quality, that is to say of a purity superior to one ppm. In carrier gasses, such as nitrogen or hydrogen, each impurity is in a concentration less than one ppm. For the other gasses, the sum of concentrations of each impurity is less than one ppm. The metallic sources present a purity 7N, that is to say 99.99999% purity rates. The reactor heating system in which the quartz tube is located is usually an oven containing several distinct zones:

- a source zone in a portion of the quartz tube where the container of liquid Group III metal source is located (i.e., the liquid gallium source),
- a substrate zone where the substrate is placed during the growth,
- and optionally, a central or mixing zone between the source and substrate zones, where the homogenization of gasses is performed.

The GaN layers are generally grown on the substrate at temperatures in the substrate zone of up to 1000° C.

The main problem concerning the growth of GaN by HVPE is the presence of a parasitic deposition, also called parasitic nucleation, in front and above the substrate on the walls of the quartz tube of the reactor. This parasitic nucleation leads to an undesired modification of the composition of the vapor phase above the substrate by the consumption of GaCl and $NH_3$ on one hand, and the production of excess HCl and $H_2$ on the other hand. This modification of the vapor phase is hardly quantifiable. The control and the reproducibility of growth results are therefore altered. Besides, it is difficult to realize selective epitaxies in the presence of parasitic nucleation. Other inconveniences of this parasitic nucleation are the deterioration and weakening of the walls of the quartz tube reactor, and a strong unintentional doping the epitaxial layer.

The carrier gas can be hydrogen, an inert gas chosen from nitrogen, helium, argon or a mixture thereof. In the case where the carrier gas is an inert gas, the parasitic nucleation is very important because it affects the time for $GaCl_3$ gas to achieve the equilibrium in the vapor phase. The supersaturation is then very important at the exit of the gas sources tubes, which provide $NH_3$ and HCl for the GaCl generation. In the case where the carrier gas is hydrogen, it is easier to reduce this parasitic deposition, but to the detriment of the growth rate of the epitaxial layer.

Consequently, it is desirable to obtain a higher GaN growth rate with the lowest possible parasitic nucleation.

BRIEF SUMMARY OF THE INVENTION

A first preferred embodiment of the present invention provides a method of producing an epitaxial layer of gallium nitride on a substrate by hydride vapor-phase epitaxy (HVPE), comprising providing gallium nitride source gases to the substrate, providing an additional flow of HCl gas to the substrate, and maintaining classical negative relative supersaturation conditions during deposition of the gallium nitride layer.

A second preferred embodiment of the present invention provides an epitaxial layer of gallium nitride on a substrate produced by hydride vapor-phase epitaxy (HVPE), comprising providing gallium nitride source gasses to the substrate, providing an additional flow of HCl gas to the substrate, and maintaining classical negative relative supersaturation conditions during deposition of the gallium nitride layer.

DETAILED DESCRIPTION OF THE PREFERRED EMBODIMENTS

Figure 1:
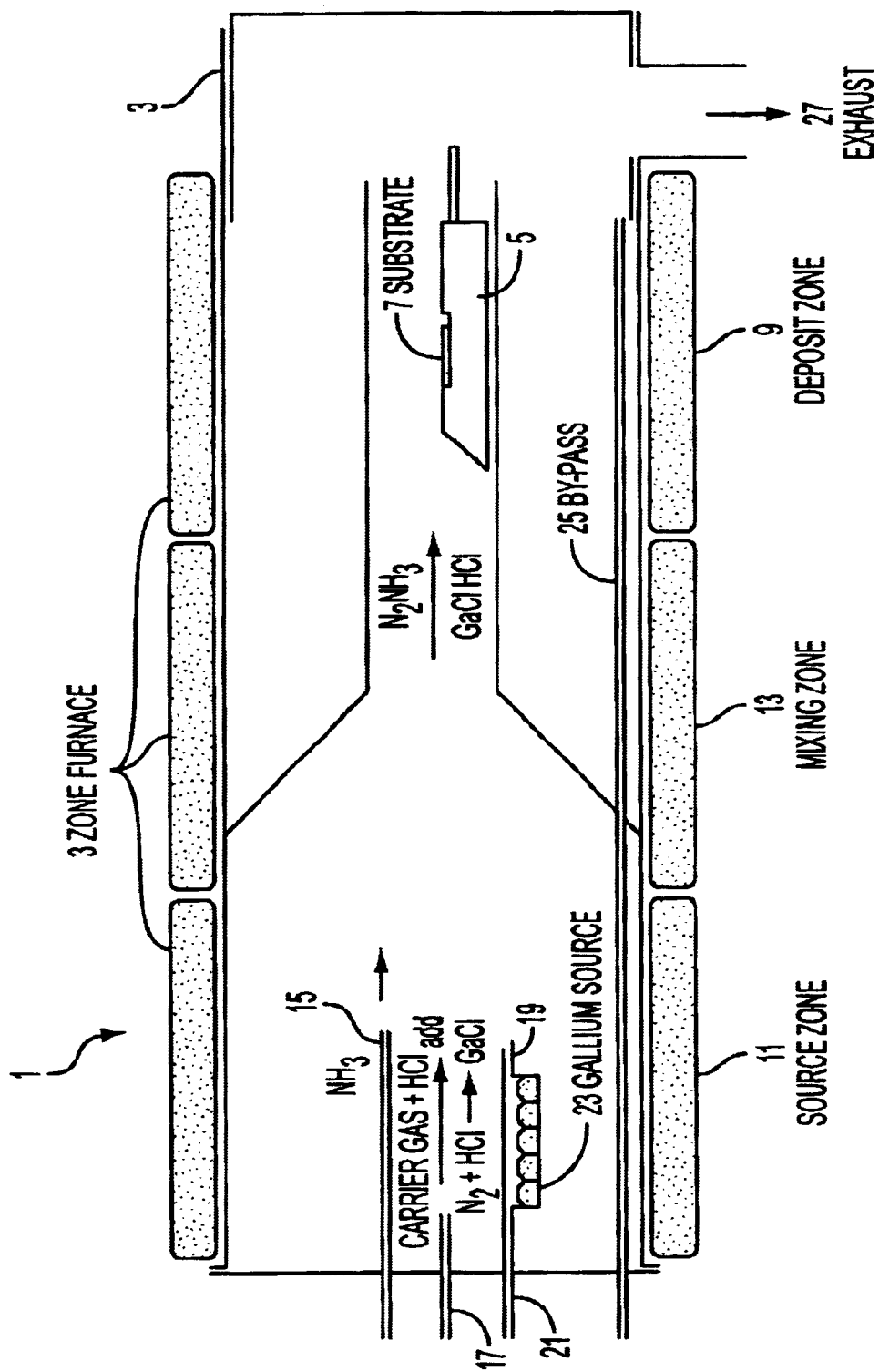
FIG. 1 is a schematic illustration of the HVPE system according to a preferred embodiment of the invention.

The inventors have discovered that by adding into the carrier gas a quantity of hydrochloric acid, at a total constant flow under classical negative supersaturation conditions, enables a high growth rate of the epitaxial layer while decreasing and even avoiding the parasitic GaN nucleation or deposition on the walls of the reactor.

The preferred embodiments of the present invention also relate to the electronic or optoelectronic components formed on such epitaxial gallium nitride layers. These layers exhibit reduced unintentional doping compared to the prior art layers. GaN compounds are in particular used to make semiconductor devices that emit light efficiently or that operate at exceptionally high frequencies.

The first preferred embodiment of present invention therefore provides a process for producing an epitaxial layer of gallium nitride by hydride vapor-phase epitaxy (HVPE) while avoiding parasitic GaN deposition on the walls of the reactor, where one of the process steps consist of adding quantities of hydrochloric acid into the carrier gas and in setting negative supersaturation conditions.

The reactor suitable for performing the process of the first preferred embodiment of the present invention most preferably contains at least two different heating zones.

Said quantities of hydrochloric acid added into the carrier gas are thereafter referred as "additional flow of HCl". The additional flow of HCl is differentiated from the "HCl source flow", which is introduced onto the gallium liquid in a sufficient quantity to form the GaCl gas. Preferably, the HCl source flow is diluted with a carrier gas, such as nitrogen, prior to being introduced into the reactor (i.e., into the quartz tube). The HCl source flow is directed at the liquid gallium container to generate GaCl gas. The HCl additional flow is diluted in the carrier gas prior to being introduced into the reactor and is directed at the substrate.

Preferably, the carrier gas is hydrogen or a mixture of hydrogen and at least one inert gas chosen among nitrogen, helium, argon or a mixture thereof.

In the framework of the process for producing an epitaxial layer of gallium nitride according to the preferred embodiment of the present invention, in the zone directly upstream of the substrate zone, the temperature is higher than the temperature in the substrate zone of the reactor.

The substrate can be chosen from the group consisting of sapphire, ZnO, 6H—SiC, $LiAlO_2$, Si, GaAs or GaN. In a preferred aspect, the substrate is nitrided before growth of the epitaxial layer, by subjecting the substrate to ammonia at an elevated temperature.

A second preferred embodiment of the present invention provides an epitaxial layer of gallium nitride obtainable by the process for producing an epitaxial layer of gallium nitride according to the first embodiment.

The thickness of the obtained epitaxial layer of gallium nitride ranges between 75 and 220 $\mu$m in one hour of deposition, depending on the experimental conditions, if the mass transfer does not reduce the growth rate. With a classical mass transfer effect, these values are reduced in the range of 1–50 $\mu$m/hours. Thus, the GaN epitaxial layer deposition rate ranges from 1 to 220 $\mu$m/hour. The GaN layer may be deposited to any desired thickness, such as 1 to 500 $\mu$m.

A third preferred embodiment of the present invention provides an optoelectronic component, especially a diode laser or an LED containing the epitaxial layer of gallium nitride according to the second embodiment of the present invention.

In the preferred aspect of the first embodiment, the ratios between the $H_2$ flow, HCl source flow and the total flow at the inlet can respectively range between $7.5*10^{-2}$ and 0.87, $2.5*10^{-3}$ and $2.5*10^{-2}$, for a $NH_3$ molar fraction of 0.25. The complementary flow is $N_2$, He or Ar. The $NH_3$ molar fraction can be increased providing that the etching of GaN by HCl and $H_2$ is kept faster than the deposition of GaN from GaCl and $NH_3$ with HCl and $H_2$ production, as deduced from the thermodynamic. The ratio between additional flow of HCl and the total flow at the inlet can range between $2.5*10^{-3}$ and $2.5*10^{-2}$. Thus, the ratio of $H_2$ flow: total flow is ($7.5*10^{-2}$ to 0.87):1. The ratio of source HCl flow: total flow is ($2.5*10^{-3}$ to $2.5*10^{-2}$):1. The ratio of additional HCl flow: total flow is ($2.5*10^{-3}$ to $2.5*10^{-2}$):1.

FIG. 1 illustrates an HVPE system according to a preferred embodiment of the present invention. The system 1 includes a quartz tube reactor 3 located in a three zone furnace. A susceptor or wafer boat 5 which supports the substrate 7 is located in a substrate or deposition zone 9 of the reactor. The gas outlets or tubes which provide the gallium nitride source gases are located in a source zone 11 of the reactor. A mixing zone 13 is located between the source and the substrate zones. The tube 3 preferably has a smaller inner diameter in the substrate zone 9 than in the source zone 11. The source zone 11 contains three outlets 15, 17 and 19. The ammonia gas is provided through the first outlet 15 toward the substrate 7. The carrier gas and the additional HCl gas are provided through the second outlet 17 toward the substrate 7. The source HCl gas diluted with the nitrogen is provided through a tube 21 to a liquid gallium container 23. The source HCl reacts with the liquid gallium to generate GaCl gas from the third outlet 19, which is connected to the liquid gallium container 23. Thus, the additional HCl, ammonia, GaCl and the carrier gas are mixed in the mixing zone 13 and provided to the substrate zone 9. The system 1 also contains a by-pass 25 and an exhaust 27.

As set forth previously, the HVPE reactor comprises at least two different heating zones. When the reactor comprises two zones, the temperature in the source zone can range between 900° C. and 1100° C. and in the substrate zone between 800° C. and 1000° C. Preferably, the source zone temperature is higher than the substrate zone temperature. In the case of a three or more heating zone reactor, the temperature in the source zone, the central zone and the substrate zone can respectively range between 800° C. and 900° C., 900° C. and 1100° C., 800° C. and 1000° C. Each zone can comprise more than one heating system so as to obtain more than three different heating zones.

HVPE GaN layer deposition occurs in a limited temperature range. No GaN layer growth occurs above a certain temperature. This temperature varies for different deposition conditions. The source or central zone located directly upstream of the substrate zone is preferably kept between a temperature higher than the temperature value canceling the growth of the GaN layer and a temperature that is about 10° C. lower than the temperature value canceling the growth of the GaN layer on the substrate. This temperature value canceling the growth of the GaN nitride layer can be determined and approached using the formula (22) provided below. The substrate temperature is preferably kept at a value 50–100° C. lower than the temperature value canceling the GaN on the substrate, to get the highest growth rate possible without parasitic deposition on the quartz walls around the substrate.

As far as the geometry of the reactor is concerned, any geometry, i.e. relative position of the substrate to the mixing zone, size of the reactor, positioning of the inlets, etc., may be adapted to perform the process according to the preferred embodiments of the invention.

All the gas inlets are preferably kept at a distance from the substrate zone long enough to provide a good mixing before the substrate zone. When one or two inlets are close to the substrate, the temperature in the reactor should be increased up to a value high enough to prevent a parasitic deposition. A good mixing gives a better control of the advantage of the process. The geometry of the substrate zone may be conventional, with the objective to get a fast flow and a homogeneous layer thickness. The substrate can be, as usual, located parallel to the vapor flow or, in order to reduce the mass transfer, inclined with respect to the vapor flow.

As the growth rate of the epitaxial layer is a function of several physical parameters (reactor geometry, temperature profile, gas flow rates, partial pressure of reactants, etc.) a phenomenological model is useful to reach the appropriate operating conditions to avoid the parasitic nucleation.

The inventors have established a growth mechanism capable of modeling the reaction of GaN growth in the reactor.

The surface process of the model involves the adsorption of $NH_3$ molecules, the adsorption of N atoms resulting from NH₃ decomposition, then the adsorption of GaCl molecules over the N atoms, and finally the chlorine desorption.

Two desorption mechanisms of chlorine are considered: desorption in $HCl_g$ molecules following a surface reaction with $H_{2g}$ leading to an intermediate HCl adsorption state, and desorption in $GaCl_{3g}$ molecules following an absorption of GaCl on two GaCl underlying molecules, according to the reactions:

$$2NGaCl+H_{2g} \leftrightarrows 2NGa-ClH \qquad (1)$$

$$NGa-ClH \leftrightarrows NGa+HCl_g \qquad (2)$$

$$2NGaCl+GaCl_g \leftrightarrows 2NGa-GaCl_3 \qquad (3)$$

$$2NGa-GaCl_3 \leftrightarrows 2NGa+GaCl_{3g} \qquad (4)$$

Where g subscript is used for gas phase species.

The two overall reactions of deposit corresponding to the two growth mechanisms are:

$$V+NH_{3g}+GaCl_g \leftrightarrows NGa+HClg+H_{2g} \qquad (6)$$

$$2V+2NH_{3g}+3GaCl_g \leftrightarrows 2NGa+GaCl_{3g}+3H_{2g} \qquad (7)$$

These two mechanisms, (6) as the H₂ mechanism, and (7) as the GaCl₃ mechanism, are disclosed in E. Aujol et al., "Thermodynamical and kinetic study of the GaN growth by HVPE under nitrogen", *Journal of Crystal Growth* 222 (2001) 538–548, which is incorporated herein by reference.

At a thermodynamical level, the following relations define the degree of excess of the deposition reaction in the H₂ and GaCl₃ mechanism:

$$\frac{P_{NH_3}P_{GaCl}}{P_{H_2}P_{HCl}K_6(T)} = 1+\gamma \qquad (11)$$

$$\frac{P_{NH_3}^2 P_{GaCl}^3}{P_{H_2}^3 P_{GaCl_3} K_7(T)} = (1+\gamma)^2 \frac{P^*_{GaCl_{3g}}}{P_{GaCl_3}} \qquad (12)$$

with $$P^*_{GaCl_{3g}} = \frac{P_{GaCl}P_{HCl}^2}{P_{H_2}K_g(T)} \qquad (13)$$

Where $K_i(T)$ is the equilibrium constant of the $R_i$ reaction.

The relative supersaturation γ is defined as the degree of excess (1+γ) minus one. Its value is positive in condition of growth, equal to zero at vapor-crystal thermodynamic equilibrium and negative in condition of etching. Preferably, the additional HCl gas flow is added in an amount sufficient to set γ<0. For example, the additional HCl flow is 10–70 cm³/min to reach a γ value in a range between –0.6 and –0.9, during deposition.

Most of the prior art GaN epitaxy experiments are carried out at high relative supersaturation values, which explains the usual parasitic deposition observed on the quartz walls.

Another mechanism which has not been disclosed before has to be considered to give a complete model of the reaction: dechloruration of NGaCl by $GaCl_g$ in $GaCl_{2g}$ and a chloruration of NGa by HCl followed by $H_{2g}$ desorption for the reverse reaction. The involved reactions are:

$$NGaCl+GaCl_g \rightarrow NGa+GaCl_{2g} \qquad (15)$$

$$NGa-HCl \leftarrow NGa+HCl_g \qquad (16)$$

$$2NGaCl+H_{2g} \leftarrow 2NGa-HCl \qquad (17)$$

$$NGaCl+GaCl_g \leftarrow NGa+GaCl_{2g} \qquad (18)$$

and for the equilibrium vapor reaction:

$$HCl_g+GaCl_g \leftarrow GaCl_{2g}+\tfrac{1}{2}H_{2g} \qquad (19)$$

In place of γ of the H₂ mechanism, a relative supersaturation $\gamma_{mix}$ is given by:

$$1+\gamma_{mix} = \qquad (21)$$

$$(1+\gamma)\sqrt{\frac{m_{HCl}}{m_{GaCl}}}\frac{P_{GaCl}}{\sqrt{kTP_{H_2}}}\frac{\sqrt{z_{H_{2g}}}}{z_{HCl_g}}\frac{z_{NGaCl}}{z_{NGa}}\exp\left(-\frac{1.49*10^3}{1.9857T}\right)$$

in SI units, where $z_i$ and $z_{ig}$ are the partition functions of the adsorbed molecule i and of the vapor molecule ig in a unit volume.

Thus, the term "GaN deposition in classical negative relative supersaturation conditions" means operating conditions where γ is less than zero and $\gamma_{mix}$ is greater than zero. Preferably, these conditions are fast HCl etching conditions, as expected by the classical reactions (6) and (7).

By numerically expressing the partial pressures in atmosphere of the formula (21), formula (22) can be obtained $$\frac{1+\gamma_{mix}}{1+\gamma} = \qquad (22)$$

$$\frac{P_{GaCl}}{\sqrt{P_{H_2}}}\left(\frac{0.780206*\exp\left(\frac{2.328988*10^4}{T}\right)*\left(1-\exp-\frac{3.9*10^3}{T}\right)}{T^{7/4}}\right)$$

$$\exp(1.75*10^{-3}(T-1000))\exp\left(\frac{4.1*10^3(\theta_{NGaCl}+1.2\theta_{GaCl_3})}{T}\right)$$

Where $\theta_{NGaCl}$ and $\theta_{GaCl}$, are the surface coverage of NGaCl and GaCl₃.

This relation enables one to obtain the working temperatures of the various zones of the reactor in order to perform the process according to the first preferred embodiment of the present invention starting from given experimental parameters.

The partial pressure values and then (1+γ) and the $\theta_i$ values are computed by taking into account the mass transfer. The zero value of $\gamma_{mix}$ is therefore deduced from the γ value by considering the input partial pressure values. In these conditions, $\theta_{GaCl_g}$ can be overlooked. The $\theta_{NGaCl}$ value is in the range 0.05–0.15 at the $\gamma_{mix}$ zero point and increases by lowering the substrate temperature. Therefore, the relation (22) can be used to predict the temperature of the $\gamma_{mix}$ canceling (i.e., where $\gamma_{mix}$=0, and where epitaxial deposition on the substrate ends).

The computation of the partial pressures has to consider the rate of transformation of HCl in GaCl at the Ga source and the species balance equations in the source line. A first approach can be made by considering the ratio between the input HCl flow over the source and the input total flow, times a rate of transformation, 0.95 for example, for the GaCl partial pressure. The other partial pressures can also be estimated by the ratios between their input flow and the input total flow. This approach leads to a $\gamma_{mix}$ value of 0.05 to 0.3 at the temperatures where an exact calculation gives the $\gamma_{mix}$ canceling.

By lowering the substrate temperature by 50° C. to 100° C. from its $\gamma_{mix}$ canceling value, growth rates of 25–50 μm/h can be obtained. A too large temperature difference increasing too much the $\gamma_{mix}$ value, leads to a parasitic deposition over the substrate, without any benefit for the growth rate.

Therefore, the temperature range of the deposition process can be determined from formula (22), given the partial pressures and $\theta_i$ values, and setting $\gamma<0$ and $\gamma_{mix}>0$. Preferably, the optimum temperature which satisfies these conditions is selected.

For example, with a $NH_3$ flow of 300 cm$^3$/min, a HCl source flow of 20 cm$^3$/min diluted in a 83 cm$^3$/min $N_2$ flow, a HCl additional flow of 20 cm$^3$/min, a 500 cm$^3$/min $H_2$ flow and a total flow of 2403 cm$^3$/min, the computed temperature of the $\gamma_{mix}$ canceling is 1335 K.

With a $NH_3$ flow of 300 cm$^3$/min, a HCl source flow of 7 cm$^3$/min, diluted in a 96 cm$^3$/min $N_2$ flow, a HCl additional flow of 6 cm$^3$/min, a 1994 cm$^3$/min $H_2$ flow and a total flow of 2403 cm$^3$/min, the computed temperature of the $\gamma_{mix}$ canceling is 1174 K.

The process according to the preferred embodiments of the present invention enables the growth of GaN to reach all the possibilities of growing at rates between 10 to 100 μm/h.

All processes of producing GaN layers which contain a step of selective epitaxy can be suitable to implement the operating conditions according to the preferred embodiments of the present invention.

The selective growth can, for example, be obtained on different substrates such as sapphire, GaN, GaAs or Si. The substrate optionally can contain patterned dielectric layers which form masks, which can present different geometries for deposition.

Gallium nitride can be doped with a doping element, such as for example, magnesium, zinc, cadmium, beryllium, calcium or carbon, during or after deposition. Furthermore, other Group III and Group V elements, such as In, Al and As may be added during deposition to deposit a ternary or a quaternary III–V semiconductor layer, such as InGaN, AlGaN, InAlGaN, AlGaAsN, InGaAsN, etc.

The following examples illustrate the preferred embodiments of the present invention.

EXAMPLES

A three-zone hot wall horizontal reactor having the following characteristics was used: a quartz tube having a length of 1400 mm, an inner diameter of 55 mm in the source zone and in the center zone, and 35 mm in the substrate zone.

The temperature was 850° C. in the source zone, 1020° C. in the central or mixing zone and 980° C. in the substrate zone. The experiment was performed with a mixed $N_2/H_2$ carrier gas.

The exits of the tubes (19 and 15 in FIG. 1) providing the gas species GaCl and $NH_3$ were respectively located at 42 cm and 28 cm from the substrate. The total flow was 2403 cm$^3$/min.

The sample was introduced into the reactor at ambient temperature. The reactor was heated to deposition temperature with nitrogen as a carrier gas. Then the substrate was subjected to a nitriding step for 15 minutes under a flow of 300 cm$^3$/min of $NH_3$, after which the GaN growth took place.

The cool down after deposition of the epitaxial layer was performed by thermal inertia with nitrogen as a carrier gas, under 50 cm$^3$/min of $NH_3$ down to 800° C., and then only with nitrogen to room temperature.

In a range of $N_2/H_2$ mixing varying with the experimental conditions, the growth rate did not depend on the amount of additional HCl flow and growth rate values of 50–60 μm/h could be obtained with very negative values of the $\gamma$ supersaturation, then in expected conditions of fast etching by HCl.

A set of experiments was performed at 500 cm$^3$/min of $H_2$ with additional HCl flow values of 20, 30, 40, 60 and 65 cm$^3$/min. At 40 cm$^3$/min the growth rate value was 40 μm/h on GaN and 10 μm/h on sapphire substrates. At 65 cm$^3$/min the 10 μm/h growth rate value was measured on a GaN substrate. The zero $\gamma$ value corresponds to an additional HCl flow of 6.5 cm$^3$/min. For additional HCl flow >6.5 cm$^3$/min, $\gamma$ is <0. For 20, 30, 40 and 65 cm$^3$/min, the $\gamma$ values are –0.63, –0.75, –0,81 and –0.89.

While the invention has been described in detail and with reference to specific embodiments thereof, it will be apparent to one skilled in the art that various changes and modifications can be made therein without departing from the scope of the invention. Thus, the breadth and scope of the present invention should not be limited by any of the above-described exemplary embodiments, but should be defined only in accordance with the following claims and their equivalents.

We claim:

1. A method of producing an epitaxial layer of gallium nitride on a substrate by hydride vapor(-phase epitaxy (HVPE), comprising:

providing gallium nitride source gases to the substrate;

providing an additional flow of HCl gas to the substrate; and maintaining classical negative relative supersaturation conditions during deposition of the gallium nitride layer.

2. The process of claim 1, wherein the step of providing the gallium nitride source gases to the substrate comprises:

providing an ammonia gas to the substrate;

providing a GaCl source gas to the substrate; and providing a carrier gas to the substrate.

3. The method of claim 2, wherein the step of providing the GaCl source gas to the substrate comprises providing a flow of source HCl gas to a liquid gallium container to generate the GaCl gas.

4. The method of claim 3, wherein:

the step of providing the GaCl source gas to the substrate comprises providing the flow of the source HCl gas diluted with nitrogen into a reactor toward the liquid gallium container located in the reactor to generate the GaCl gas; and providing the additional flow of HCl gas to the substrate comprises providing HCl gas into the reactor containing the substrate toward the substrate.

5. The method of claim 4, wherein the carrier gas comprises:

hydrogen; or a mixture of hydrogen and an inert gas selected from nitrogen, helium, argon, or mixtures thereof.

6. The method of claim 1, wherein the epitaxial layer of gallium nitride is produced in a reactor comprising at least two temperature zones.

7. The method of claim 6, wherein the substrate is located in a substrate zone of the reactor and outlets which provide the gallium nitride source gases are located in a source zone of the reactor.

8. The method of claim 7, wherein the substrate zone is maintained at a lower temperature than the source zone during deposition of the gallium nitride layer.

9. The method of claim 7, wherein the substrate temperature is maintained at value 50–100° C. lower than a temperature at which no growth of the gallium nitride layer on the substrate occurs.

10. The method of claim 7, wherein the reactor further comprises a central zone between the substrate zone and the source zone.

11. The method of claim 10, wherein the central zone is maintained at a higher temperature than the substrate zone during deposition of the gallium nitride layer.

12. The method of claim 11, wherein:
- a temperature in the substrate zone is maintained at a temperature value 50 to 100° C. lower than a temperature at which no growth of the gallium nitride layer on the substrate occurs; and
- a temperature in at least one of the source zone and the central zone is maintained at a temperature value between 10° C. lower than a temperature at which no growth of the gallium nitride layer on the substrate occurs and a temperature value higher than a temperature at which no growth of the gallium nitride layer on the substrate occurs.

13. The method of claim 1, wherein the substrate is chosen from a group consisting of sapphire, ZnO, 6H—SiC, Si, $LiAlO_2$, GaAs and GaN.

14. The method of claim 1, further comprising nitriding the substrate before depositing the gallium nitride layer.

15. The method of claim 1, further comprising forming an optoelectronic device over the deposited epitaxial gallium nitride layer.

16. The method of claim 1, wherein the optoelectronic device comprises a laser or a light emitting diode.

17. The method of claim 1, wherein substantially no parasitic nucleation occurs on walls of a deposition reactor during the deposition of the gallium nitride layer.

18. The method of claim 3, wherein the classical negative relative supersaturation conditions are maintained during deposition by selecting deposition conditions such that $\gamma$ is less than zero and $\gamma_{mix}$ is greater than zero, where $\gamma$ is defined by:

$$\frac{P_{NH_3} P_{GaCl}}{P_{H_2} P_{HCl} K_6(T)} = 1 + \gamma \quad (11)$$

$$\frac{P_{NH_3}^2 P_{GaCl}^3}{P_{H_2}^3 P_{GaCl_3} K_7(T)} = (1+\gamma)^2 \frac{P^*_{GaCl_{3g}}}{P_{GaCl_3}} \quad (12)$$

with $$P^*_{GaCl_{3g}} = \frac{P_{GaCl} P_{HCl}^2}{P_{H_2} K_g(T)} \quad (13)$$

and $\gamma_{mix}$ is defined by:

$$1 + \gamma_{mix} = \quad (21)$$

$$(1+\gamma)\sqrt{\frac{m_{HCl}}{m_{GaCl}}} \frac{P_{GaCl}}{\sqrt{kTP_{H_2}}} \frac{\sqrt{z_{H_{2g}}}}{z_{HCl_g}} \frac{z_{NGaCl}}{z_{NGa}} \exp\left(-\frac{1.49*10^3}{1.9857T}\right)$$

in SI units, where $z_i$ and $z_{ig}$ are partition functions of an adsorbed molecule i and of a vapor molecule ig in a unit volume, and $K_i(T)$ is an equilibrium constant of a $R_i$ reaction.

19. The method of claim 18, further comprising selecting a deposition temperature such that $\gamma$ is less than zero and $\gamma_{mix}$ is greater than zero from a following relationship:

$$\frac{1+\gamma_{mix}}{1+\gamma} = \quad (22)$$

$$\frac{P_{GaCl}}{\sqrt{P_{H_2}}} \left( \frac{0.780206*\exp\left(\frac{2.328988*10^4}{T}\right)*\left(1-\exp-\frac{3.9*10^3}{T}\right)}{T^{7/4}} \right)$$

$$\exp(1.75*10^{-3}(T-1000))\exp\left(\frac{4.1*10^3(\theta_{NGaCl}+1.2\theta_{GaCl_3})}{T}\right)$$

where $\theta_{NGaCl}$ and $\theta_{GaCl_g}$ are surface coverage of NgaCl and $GaCl_g$.

20. The method of claim 18, wherein the additional HCl flow is added in an amount such that $\gamma$ is less than zero.

21. The method of claim 18, wherein the additional HCl flow is added in the amount such that $-0.6<\gamma<-0.9$.

22. The method of claim 5, wherein:
- $H_2$ flow:total flow=$(7.5*10^{-2}$ to $0.87)$:1;
- source HCl flow:total flow=$(2.5*10^{-3}$ to $2.5*10^{-2})$:1; and
- additional HCl flow:total flow=$(2.5*10^{-3}$ to $2.5*10^{-2})$:1.

* * * * *

UNITED STATES PATENT AND TRADEMARK OFFICE
CERTIFICATE OF CORRECTION

PATENT NO.      : 6,632,725 B2
DATED           : October 14, 2003
INVENTOR(S)     : Agnès Trassoudaine et al.

It is certified that error appears in the above-identified patent and that said Letters Patent is hereby corrected as shown below:

<u>Title Page,</u>
Item [*] Notice, should read as follows:
-- [*] Notice:    Subject to any disclamer, the term of this
                  patent is extended or adjusted under 35
                  U.S.C. 154(b) by 20 days. --.

Signed and Sealed this

Tenth Day of February, 2004

JON W. DUDAS
*Acting Director of the United States Patent and Trademark Office*